(12) United States Patent
Hoshi et al.

(10) Patent No.: US 9,650,725 B2
(45) Date of Patent: May 16, 2017

(54) METHOD FOR MANUFACTURING A DEFECT-CONTROLLED LOW-OXYGEN CONCENTRATION SILICON SINGLE CRYSTAL WAFER

(71) Applicant: SHIN-ETSU HANDOTAI CO., LTD., Tokyo (JP)

(72) Inventors: Ryoji Hoshi, Nishigo-mura (JP); Hiroyuki Kamada, Nishigo-mura (JP); Kosei Sugawara, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 343 days.

(21) Appl. No.: 14/379,522

(22) PCT Filed: Feb. 15, 2013

(86) PCT No.: PCT/JP2013/000833
§ 371 (c)(1),
(2) Date: Aug. 19, 2014

(87) PCT Pub. No.: WO2013/136666
PCT Pub. Date: Sep. 19, 2013

(65) Prior Publication Data
US 2015/0020728 A1 Jan. 22, 2015

(30) Foreign Application Priority Data

Mar. 16, 2012 (JP) .................. 2012-060538

(51) Int. Cl.
*C30B 15/20* (2006.01)
*C30B 29/06* (2006.01)

(52) U.S. Cl.
CPC ............ *C30B 15/203* (2013.01); *C30B 29/06* (2013.01)

(58) Field of Classification Search
CPC ......... C30B 15/00; C30B 15/14; C30B 15/20; C30B 15/203; C30B 15/206; C30B 29/00; C30B 29/02; C30B 29/06
(Continued)

(56) References Cited

U.S. PATENT DOCUMENTS

| 5,919,302 A | 7/1999 | Falster et al. |
| 6,120,598 A | 9/2000 | Iida et al. |

(Continued)

FOREIGN PATENT DOCUMENTS

| JP | A-05-155682 | 6/1993 |
| JP | A-08-002993 | 1/1996 |

(Continued)

OTHER PUBLICATIONS

Jan. 6, 2015 Office Action issued in Japanese Application No. 2012-60538.
(Continued)

*Primary Examiner* — Kenneth A Bratland, Jr.
(74) *Attorney, Agent, or Firm* — Oliff PLC

(57) ABSTRACT

The present invention provides a method for manufacturing a silicon single crystal wafer, wherein, under a growth condition that $V/G \geq 1.05 \times (V/G)_{crt}$ is achieved where V is a growth rate in growth of the silicon single crystal ingot, G is a temperature gradient near a crystal growth interface, and $(V/G)_{crt}$ is a value of V/G when a dominant point defect changes from a vacancy to interstitial Si, a silicon single crystal ingot having oxygen concentration of $7 \times 10^{17}$ atoms/cm³ (ASTM'79) or less is grown, and a silicon single crystal wafer which includes a region where the vacancy is dominant and in which FPDs are not detected by preferential etching is manufactured from the grown silicon single crystal ingot. As a result, there is provided the method that enables manufacturing a low-oxygen concentration silicon
(Continued)

single crystal wafer that can be preferably used for a power device with good productivity at a low cost.

11 Claims, 11 Drawing Sheets

(58) Field of Classification Search
USPC ...... 117/11, 13–15, 19–20, 30, 32, 200–202, 117/206, 208, 217, 906, 928, 931–932
See application file for complete search history.

(56) References Cited

U.S. PATENT DOCUMENTS

| | | | |
|---|---|---|---|
| 6,548,035 | B1 | 4/2003 | Kimura et al. |
| 2002/0157598 | A1* | 10/2002 | Hoshi .................. C30B 15/203 117/13 |
| 2003/0051660 | A1* | 3/2003 | Koya .................. C30B 15/203 117/84 |
| 2003/0070605 | A1 | 4/2003 | Hoshi et al. |
| 2010/0258050 | A1* | 10/2010 | Hoshi .................. C30B 15/14 117/217 |

FOREIGN PATENT DOCUMENTS

| | | |
|---|---|---|
| JP | A-11-116391 | 4/1999 |
| JP | A-2001-278692 | 10/2001 |
| JP | A-2001-518874 | 10/2001 |
| JP | A-2009-161416 | 7/2009 |
| WO | WO 01/27362 A1 | 4/2001 |
| WO | WO 01/57293 A1 | 8/2001 |
| WO | WO 01/83860 A1 | 11/2001 |

OTHER PUBLICATIONS

Oct. 7, 2014 English-language International Preliminary Report on Patentability issued in International Application No. PCT/JP2013/000833.
Edited by UCS Handotai Kiban Gijutsu Kenkyukai, Silicon no Kagaku, Kabushiki Kaisha Realize Sha, Jun. 28, 1996, pp. 171-172, 985.
Edited by Katsuro Fukami, Saishin Silicon Device to Kessho Gijutsu—Sentan Lsi ga Yokyu suru Wafer Gijutsu no Genjo-, Realize Riko Center, Dec. 26, 2005, pp. 181-183, 193-202, 273-274.
International Search Report issued in International Application No. PCT/JP2013/000833 dated Apr. 23, 2013.

* cited by examiner

METHOD FOR MANUFACTURING A DEFECT-CONTROLLED LOW-OXYGEN CONCENTRATION SILICON SINGLE CRYSTAL WAFER

BACKGROUND OF THE INVENTION

1. Field of the Invention

The present invention relates to a method for manufacturing a defect-controlled low-oxygen concentration silicon single crystal wafer used in advanced technology fields such as a memory, a CPU, or a power device in particular.

2. Description of the Related Art

In relation to energy saving, power devices is recently attracting attention. These devices are different from other devices such as memory, a large current flows through a wafer. A region in which a current flows is not restricted to an extremely shallow surface layer as different from the prior art, it may be a range having a thickness of tens or hundreds μm from the surface layer, or the current may flow in a thickness direction depending on a device.

If crystal defects or BMDs (Bulk Micro Defects) formed by precipitation of oxygen are present in a region where such a current flows, a problem of decrease of a breakdown voltage or increase of leak current may possibly occur. Further, since On resistance and a breakdown voltage as important characteristics of power devices are affected by specific resistance of a wafer serving as a substrate, a CZ wafer which is manufactured based on a CZ method (a Czochralski Method) has not been used for a power device because the CZ wafer contains oxygen, oxygen turns to a donor, specific resistance thereby changes.

Therefore, as a wafer that has less crystal defects and does not contain oxygen, for example, an epitaxial wafer having an epitaxial layer laminated on a wafer serving as a substrate or a wafer manufactured based on an FZ method (Floating Zone Method) has been used. However, since an epitaxial wafer is expensive or a degree of difficulty of manufacturing of an FZ crystal rises at the time of increasing a diameter, the respective cases have problems. Thus, there has been a demand for a wafer fabricated from a CZ crystal whose cost is relatively low and whose diameter can be relatively easily increased.

Patent References 1 to 7 disclose methods or apparatuses for manufacturing a single crystal based on the CZ method.

The CZ crystal is generally grown from a silicon raw material molten in a quartz crucible (a silicon melt). At this time, oxygen is eluted from the quartz crucible. Although the greater part of the eluted oxygen is evaporated, the very small part of the oxygen reaches a portion immediately below a crystal growth interface through the silicon melt, and hence a grown silicon single crystal contains the oxygen.

The contained oxygen moves and agglomerates by a heat treatment in, e.g., fabrication of a device, thereby forming oxygen precipitates called BMDs. As described above, when the BMDs are formed, a problem of leak or a breakdown voltage may possibly occur. Since generation of the BMDs can be greatly suppressed when oxygen concentration of a silicon single crystal is lowered, low oxygen concentration is demanded as quality. As an oxygen concentration reducing technology, Patent Reference 8 discloses a decrease in speed of crystal rotation or crucible rotation in an MCZ method (a magnetic field applied Czochralski method), and it is known that very low oxygen concentration such as $2 \times 10^{17}$ (atoms/cm$^3$) can be achieved.

Furthermore, it is known that crystal defects formed during crystal growth are present in a CZ crystal. Usually, a silicon single crystal has vacancies and interstitial Si as intrinsic point defects. Saturation concentration of the intrinsic point defects is a function of a temperature, and a supersaturated state of the point defects occurs with a rapid temperature fall during the crystal growth. The supersaturated point defects progress to alleviate the supersaturated state by pair annihilation, outward diffusion/uphill diffusion, or the like. In general, this supersaturated state cannot be perfectly eliminated, and either the vacancies or the interstitial Si finally remain as dominant supersaturated point defects. It is known that the state that the vacancies are surplus tends to happen when a crystal growth rate is high, and that the state that the interstitial Si is surplus tends to happen when the crystal growth rate is low. When the surplus concentration is not lower than a certain level, the point defects are agglomerated, and crystal defects are formed during the crystal growth.

As secondary defects in a region where the vacancies are dominant (a V region), an OSF nucleus or a void defect is known. The OSF nucleus is a defect that is observed as a stacking fault when a crystal sample is subjected to a heat treatment in a wet oxygen atmosphere at a high temperature of approximately 1100° C., the interstitial Si is thereby implanted from a surface, the staking fault (SF) is grown around each OSF nucleus, and preferential etching is performed while oscillating this sample in a preferential etchant. Since the staking fault grows by an oxidation treatment, this defect is called an OSF (Oxygen induced Staking Fault).

The void defect is a cavity-like defect formed by gathering vacancies, and it is known that an oxide film called an internal wall oxide film is formed on an internal wall. The name of this defect varies depending on detection methods. When a wafer surface is irradiated with a laser beam and this defect is observed by a particle counter that detects reflected light/scattered light or the like from the surface, the defect is called a COP (Crystal Originated Particle). When a sample is left in a preferential etchant for a relatively long time without being oscillated and this defect is observed as a flow pattern, it is called an FPD (Flow Pattern Defect). When this defect is observed by infrared scattering tomography (LST: Laser Scattering Tomography) in which an infrared laser beam is entered from a surface of a wafer and scattered light from this surface is detected, it is called an LSTD (Laser Scattering Tomography Defect). Although the detection methods are different, these defects are all considered as void defects.

On the other hand, in a region where the interstitial Si is dominant (an I region), crystal defect obtained by agglutinating the interstitial Si is formed. Although this defect is not clearly identified, it is considered as a dislocation loop or the like, and the defect that is large in size is found by TEM (Transmission Electron Microscopy) observation as a dislocation loop cluster. A secondary defect of this interstitial Si is observed as a large pit when the same etching method as the FPD is performed, namely, when a sample is left in a preferential etchant for a relatively long time without being oscillated. This is called an LEP (Large Etch Pit) or the like.

CITATION LIST

Patent Literatures

Patent Literature 1: Japanese Unexamined Patent Publication(kokai) No. Hei 8-2993

Patent Literature 2: Japanese Unexamined Patent Publication(kokai) No. Hei 11-116391
Patent Literature 3: Japanese Unexamined Patent Publication(kokai) No. 2001-278692
Patent Literature 4: WO01/083860
Patent Literature 5: WO01/027362
Patent Literature 6: WO01/057293
Patent Literature 7: Japanese Unexamined Patent Publication(kokai) No. 2009-161416
Patent Literature 8: Japanese Unexamined Patent Publication(kokai) No. Hei 5-155682

SUMMARY OF THE INVENTION

Problems to be Solved by the Invention

As described above, in CZ crystals for an advanced technology device such as power devices or the like, less crystal defects and low oxygen concentration have been demanded.

As to these demands, the present inventors found out that a low-defect wafer which has low-oxygen concentration and from which FPDs are not detected is suitable for a power device.

Sensitivity of a defect evaluation method cannot be unconditionally determined since it is affected by performance of the particle counter (a wavelength or detection sensitivity), performance of the infrared scattering tomography (incident light intensity or detection sensitivity), oxygen concentration, and others, but it is considered from a result of an experiment conducted by the present inventors that the relation of LSTD>COP≈FPD is obtained and sensitivity for LSTDs is high in a low-oxygen concentration region.

As described above, in a single crystal in at least a low-oxygen concentration region, it is considered that detection sensitivity for LSTDs is high and even a defect that is very small or hard to be detected can be detected, but the present inventors have found that a defect size that cannot be detected as an FPD whose sensitivity is lower than LSTD does not become a cause for a device failure and such a single crystal can be sufficiently used for a power device or the like. Therefore, a technology that provides a crystal which has low-oxygen concentration and from which FPDs are not detected is necessary.

As a region where the FPDs are not detected, using a portion near a so-called defect-free region can be considered. However, this defect-free region is a narrow region that appears between a vacancy dominant region that appears when a growth rate is high and an interstitial Si dominant region that appears when the growth rate is low, control over pulling a single crystal for realizing conditions that the defect-free region is provided is difficult. Furthermore, such a crystal growth rate is generally low, and it is difficult to say that a productivity and a cost are superior.

Thus, a technology that reduces a defect size until FPDs are no longer detected in the vacancy dominant region that appears when the growth rate is high is demanded. As such a technology, each of Patent Literatures 1 and 2 discloses a technology that shortens a defect forming temperature zone passage time and reduces a defect size in manufacture of a single crystal. Moreover, each of Patent Literatures 3 and 4 discloses a technology that takes not only a defect forming temperature zone but also concentration of excessive point defects into consideration. Additionally, Patent Literature 5 discloses a technology that reduces defects by doping nitrogen with respect to a single crystal.

However, in these technologies, although a reduction in defect density is achieved in all cases, but a condition that density of FPDs become 0 is not achieved. Further, since they do not have a viewpoint of a wafer for a power device, a standpoint of low-oxygen concentration is not examined either.

In view of the above-described problem, it is an object of the present invention to provide a method for manufacturing a low-oxygen concentration single crystal wafer, which can be preferably used for, e.g., a power device, with good productivity at a low cost.

Means for Solving the Problems

To achieve the object, according to the present invention, there is provided a method for manufacturing a silicon single crystal wafer, comprising: growing a silicon single crystal ingot with the use of a CZ single crystal manufacturing apparatus; and slicing out a silicon single crystal wafer from the grown silicon single crystal ingot, wherein, under a growth condition that $V/G \geq 1.05 \times (V/G)crt$ is achieved where V is a growth rate in growth of the silicon single crystal ingot, G is a temperature gradient near a crystal growth interface, and $(V/G)crt$ is a value of $V/G$ when a dominant point defect changes from a vacancy to interstitial Si, a silicon single crystal ingot having oxygen concentration of $7 \times 10^{17}$ atoms/cm$^3$ (ASTM'79) or less is grown, and a silicon single crystal wafer which includes a region where the vacancy is dominant and in which FPDs are not detected by preferential etching is manufactured from the grown silicon single crystal ingot.

When the silicon single crystal ingot is grown and the silicon single crystal wafer is manufactured as described above, it is possible to manufacture the low-oxygen concentration silicon single crystal wafer, in which a failure regarding a breakdown voltage or leak current does not occur in case of fabricating a device, with good productivity. Therefore, the silicon single crystal wafer that is preferable for, e.g., a power device can be manufactured at a low cost.

At this time, preferably, before growing the silicon single crystal ingot, a silicon single crystal ingot having oxygen concentration of $7 \times 10^{17}$ atoms/cm$^3$ (ASTM'79) or less was grown while changing the growth rate, $V/G$ at a maximum growth rate in the extent that FPDs of the grown silicon single crystal ingot are not detected is obtained, each defect size that is not detected as the FPD in the silicon single crystal ingot grown under a condition of the obtained $V/G$ is acquired based on point defect simulation, and the silicon single crystal ingot from which the silicon single crystal wafer is sliced out is grown under a condition such that a defect size becomes smaller than the previously obtained defect size that is not detected as FPD.

When the silicon single crystal ingot is grown as described above, the low-oxygen concentration silicon single crystal wafer from which FPDs are not detected can be assuredly manufactured.

At this time, preferably, at the time of growing the silicon single crystal ingot, nitrogen is doped to grow the silicon single crystal ingot having nitrogen concentration of $1 \times 10^{13}$ to $1 \times 10^{16}$ (/cm$^3$).

Doping nitrogen in such concentration enables reducing the defects, and the silicon single crystal wafer from which FPDs are not detected can be more easily manufactured.

At this time, preferably, the silicon single crystal ingot is grown with the use of the CZ single crystal manufacturing apparatus comprising: a main chamber in which a crucible containing a raw material melt is arranged; a pulling chamber that is connected to an upper portion of the main chamber and accommodates the grown silicon single crystal ingot; a cooling cylinder that is extended from a ceiling portion of the main chamber toward a liquid level of the raw material melt contained in the crucible and surrounds the silicon single crystal ingot that is being grown; and a cooling auxiliary cylinder disposed on the inner side of the cooling cylinder.

When such a single crystal manufacturing apparatus is used, the grown silicon single crystal ingot can be effectively cooled, and a defect size can be further reduced.

At this time, preferably, the CZ single crystal manufacturing apparatus in which a lower end of the cooling auxiliary cylinder is extended to a level of a lower end of the cooling cylinder or to a level bellow the lower end of the cooling cylinder but does not reach the liquid level of the raw material melt is used.

Such a cooling auxiliary cylinder can effectively cool a portion having a higher temperature in the silicon single crystal ingot that is being grown, thus further reducing the defect size.

At this time, preferably, the CZ single crystal manufacturing apparatus in which a slit that is continuous in an axial direction is formed in the cooling auxiliary cylinder is used.

When such a cooling auxiliary cylinder is used, it is appressed against the cooling cylinder by thermal expansion, heat can be more efficiently transferred, and hence a defect size can be assuredly reduced by more efficient cooling.

At this time, preferably, the CZ single crystal manufacturing apparatus in which a material of the cooling cylinder is any one of iron, chrome, nickel, copper, titanium, molybdenum, tungsten, and an alloy containing any one of these materials or made by coating a metal with any one of titanium, molybdenum, tungsten, and a platinum group metal is used.

At this time, preferably, the CZ single crystal manufacturing apparatus in which a material of the cooling auxiliary cylinder is any one of a graphite material, a carbon composite, stainless, molybdenum, and tungsten is used.

When such a material is used, the grown silicon single crystal ingot can be efficiently cooled, and the defect size can be sufficiently reduced.

Effect of the Invention

As described above, according to the present invention, the silicon single crystal wafer that is suitable for, e.g., a power device can be manufactured with good productivity at a low cost.

DETAILED DESCRIPTION OF THE PREFERRED EMBODIMENTS

Figure 1:
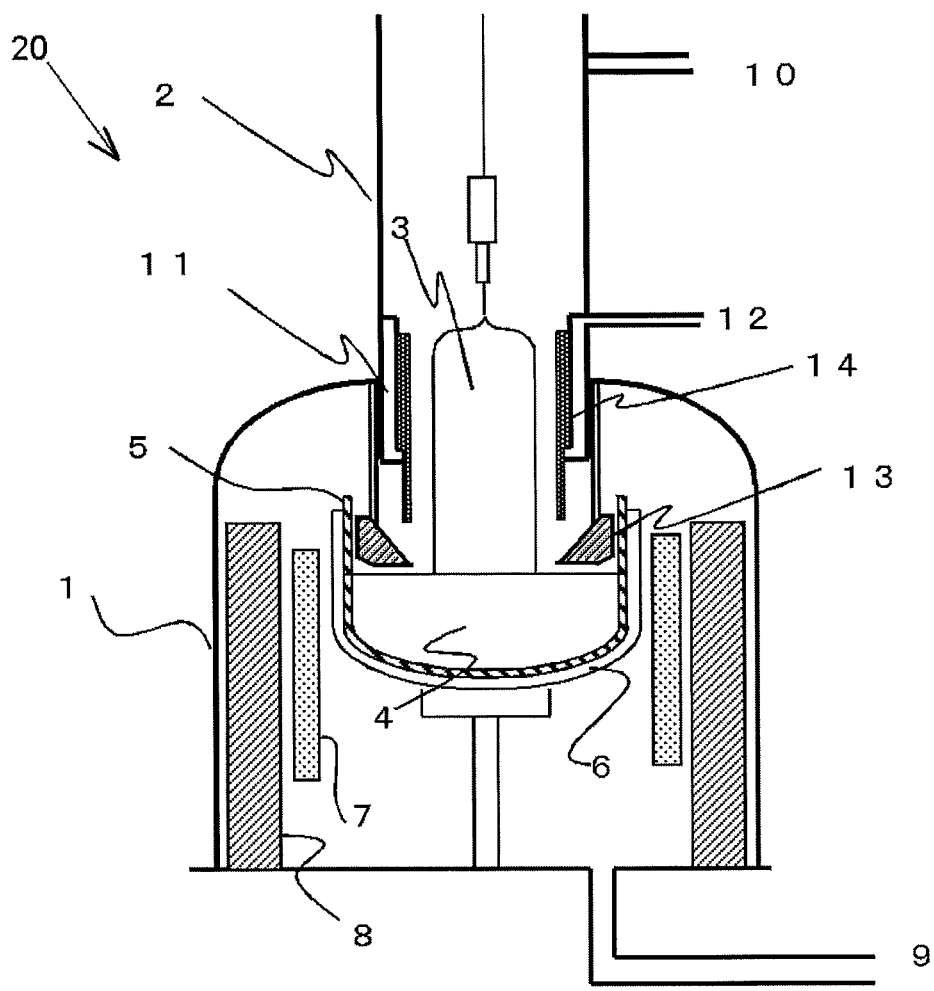
FIG. 1 is a schematic view showing an example of a CZ single crystal manufacturing apparatus that can be used for the present invention.

Although the present invention will be described in detail as an embodiment with reference to the drawings, the present invention is not restricted thereto.

The present invention provides a method for manufacturing a silicon single crystal wafer, by which a silicon single crystal ingot is grown by using a CZ single crystal manufacturing apparatus and a silicon single crystal wafer is sliced out from the grown silicon single crystal ingot.

Further, in the present invention, under growth conditions that meet V/G≥1.05×(V/G)crt where V is a growth rate in growth of a silicon single crystal ingot, G is a temperature gradient near a crystal growth interface, and (V/G)crt is a value of V/G when a dominant point defect changes from a vacancy to interstitial Si, the silicon single crystal ingot having oxygen concentration of $7 \times 10^{17}$ atoms/cm$^3$ (ASTM'79) or less is grown, and a silicon single crystal wafer that includes a region where vacancies are dominant and from which FPDs are not detected by preferential etching is manufactured from the grown silicon single crystal ingot.

In comparison with the FZ method, the CZ method enables easily growing a crystal having a large diameter of 8 inches (20 mm) or more. The present inventors discovered that a reduction in defect size occurs when oxygen concentration is set to $7 \times 10^{17}$ atoms/cm$^3$ (ASTM'79) or less in a vacancy dominant region, which appears when the growth rate is high in such single crystal manufacture based on the CZ method. Furthermore, when a defect size such that FPDs are not detected by the preferential etching is adopted, a failure regarding a breakdown voltage or leak current does not occur even if a device is fabricated. Therefore, the silicon single crystal ingot can be grown under a high-rate growth condition that V/G takes a value that is larger than (V/G)crt by 5% or more in order to manufacture a wafer in which such a device failure does not occur, and thereby productivity can be greatly improved. Considering the defect size, a larger V/G value is preferable. However, in reality, when growth is carried out at a too high rate, the single crystal is hard to be formed due to a problem of crystal deformation or the like, and hence V/G≤5×(V/G) crt is preferable.

Here, since a value of G differs depending on simulation software or a temperature zone used in calculations, comparing specific numerical values is difficult among manufacturers, a specific example is shown as follows.

Simulation software called FEMAG can be used for calculating a temperature. A given single crystal manufacturing apparatus and a temperature in a hot zone are simulated by using this software, and a temperature gradient from a melting point to 1400° C. is determined as G(K/mm). A crystal is grown by the simulated single crystal manufacturing apparatus while actually changing a growth rate V (mm/min), this crystal is vertically divided and evaluated, and a growth rate Vcrt when a dominant point defect type changes is calculated. When this value is calculated under several conditions, (V/G) crt (=Vcrt/G) is obtained as a fixed value that is 0.175 (mm$^2$/min·K) under the above-described conditions. Therefore, V/G required to obtain a target crystal is 0.184 (mm$^2$/min·K) or more in the method adopting the present invention.

Moreover, in the present invention, before growing the silicon single crystal ingot, it is preferable to grow a silicon single crystal ingot having oxygen concentration of $7 \times 10^{17}$ atoms/cm$^3$ (ASTM'79) or less in advance while changing a growth rate, calculate V/G at a maximum growth rate to the extent that FPDs of the grown silicon single crystal ingot are not detected, and use point defect simulation to obtain a defect size such that FPDs are not detected the silicon single crystal ingot grown under the obtained V/G conditions. Additionally, the silicon single crystal ingot from which the silicon single crystal wafer is sliced out can be grown under conditions that a defect size is not larger than the previously obtained defect size such that FPDs are not detected.

When the defect size such that FPDs are not detected in low-oxygen concentration is obtained in advance and the silicon single crystal ingot is grown under the condition that a defect size is not larger than the obtained defect size, the silicon single crystal wafer in which FPDs are not detected can be assuredly manufactured.

Specifically, for example, vertical division and evaluation are first carried out by using the silicon single crystal ingot grown in low-oxygen concentration of $7 \times 10^{17}$ atoms/cm$^3$ (ASTM'79) while changing the growth rate, thereby obtaining V/G with which a region where FPDs are produced shrinks. On the other hand, means for calculating the defect size from the point defect simulation is prepared, the defect size at FPD shrink V/G (V/G with which a region where FPDs are produced shrinks) obtained in the silicon single crystal ingot grown while changing the growth rate is obtained, and this value is determined as a target size. When a cooling condition (G) or the growth rate (V) in growth of the silicon single crystal ingot is changed, the size is calculated by using the defect size calculating means as described above, and the silicon single crystal ingot is grown under conditions that lower the target size, thereby assuredly achieving target quality.

Here, as a method for detecting FPDs, by leaving a sample sliced out from the silicon single crystal ingot in a preferential etchant made of, e.g., a hydrofluoric acid, a nitric acid, an acetic acid, and water without oscillating a sample, a defect called an FPD that involves a flow pattern is observed.

In the manufacturing method according to the present invention, the silicon single crystal ingot is grown based on Czochralski method by using such a CZ single crystal manufacturing apparatus as depicted in FIG. 1.

Here, the CZ single crystal manufacturing apparatus that can be used for the manufacturing method according to the present invention will now be explained.

The CZ single crystal manufacturing apparatus 20 in FIG. 1 comprises a main chamber 1, a quartz crucible 5 and a graphite crucible 6 that contain a raw material melt 4 in the main chamber 1, a heater 7 arranged around the quartz crucible 5 and the graphite crucible 6, an heat insulating material 8 around the outer side of the heater 7, and a pulling chamber 2 that is connected to an upper portion of the main chamber 1 and accommodates a grown silicon single crystal ingot 3. A gas inlet 10 from which a gas to be circulated in a furnace is introduced is provided in the pulling chamber 2, and a gas outlet 9 from which the gas circulated in the furnace is exhausted is provided in a bottom portion of the main chamber 1. Further, a heat shielding component 13 that shields against radiation of heat from the heater 7 or the raw material melt 4 can be provided. The quartz crucible 5 and the graphite crucible 6 can be moved up and down in a crystal growth axis direction, and the quartz crucible 5 and the graphite crucible 6 are moved up so as to compensate falling of a liquid level of the raw material melt 4 reduced due to crystallization during crystal growth. As a result, a height of the liquid level of the raw material melt 4 can be maintained substantially constant.

Furthermore, by installing a magnetic field generation apparatus (not shown) outside the main chamber 1 in accordance with manufacturing conditions, it is possible to use an apparatus adopting a so-called MCZ method by which a convection current of the raw material melt 4 is suppressed by applying a horizontal or vertical magnetic field to the raw material melt 4 and a single crystal is stably grown.

In the present invention, these respective units in the apparatus equal to those in the prior art can be used.

It is preferable for such an apparatus 20 to have a cylindrical cooling cylinder 11 that extends from a ceiling portion of the main chamber 1 toward the liquid level of the raw material melt 4 contained in the quartz crucible 5 and surrounds the silicon single crystal ingot 3 in a growth process and a cooling auxiliary cylinder 14 disposed on the inner side of the cooling cylinder 11. A cooling medium inlet 12 from which a cooling medium is introduced is provided to this cooling cylinder 11.

To reduce a defect size, a cooling rate of the silicon single crystal ingot is also important, and the defect size becomes smaller as more rapid cooling is performed. Therefore, an apparatus having the cooling cylinder that is forcedly cooled by the cooling medium or the cooling auxiliary cylinder that absorbs heat from the silicon single crystal ingot and transfers it to the cooling cylinder provided therein enables efficiently reducing the defect size.

Figure 2:
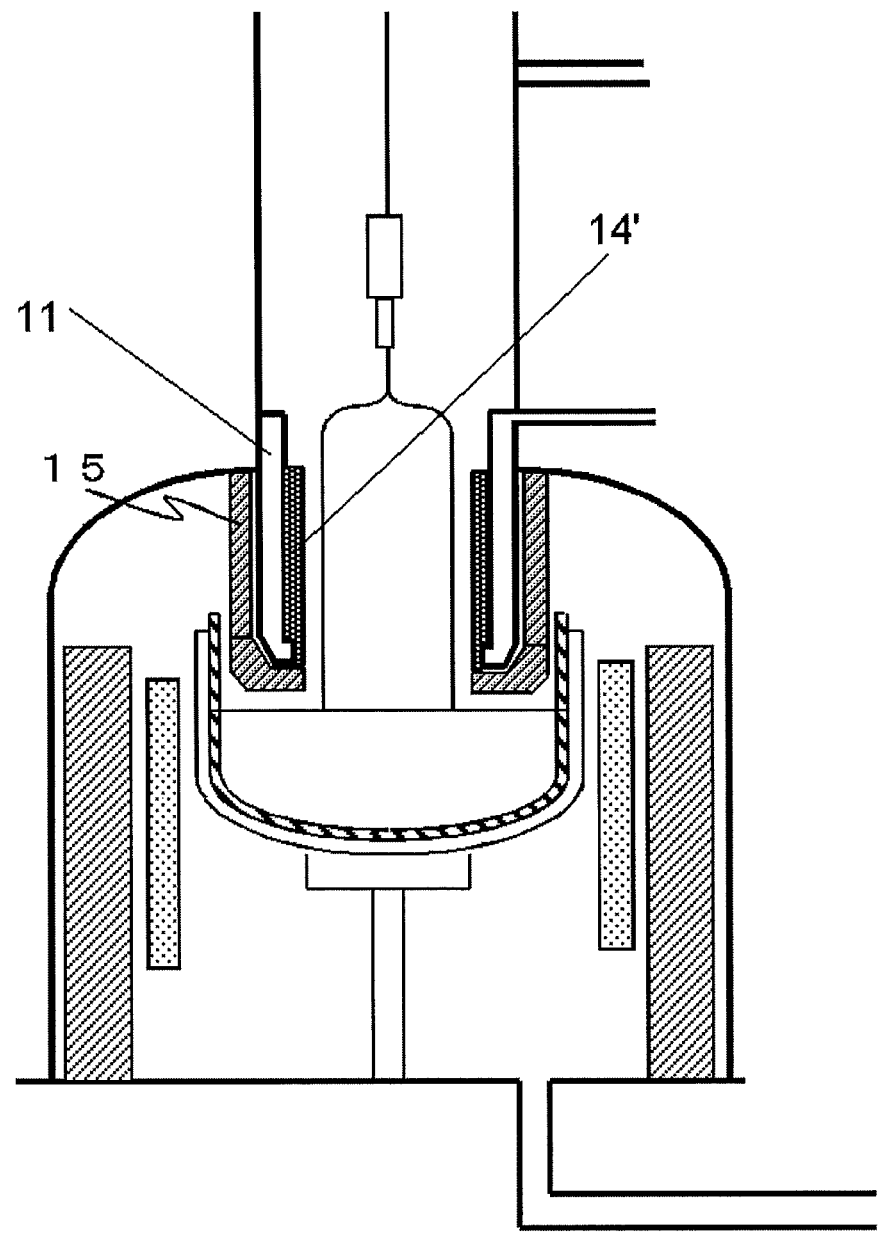
FIG. 2 is a schematic view showing another example of the CZ single crystal manufacturing apparatus that can be used for the present invention.

It is preferable for a lower end of such a cooling auxiliary cylinder 14 to downwardly extend from a lower end of the cooling cylinder 11 as shown in FIG. 1 and not reach the liquid level of the raw material melt 4, or it is preferable to adopt a cooling auxiliary cylinder 14' whose lower end is arranged at the same height as the lower end of the cooling cylinder 11 as shown in FIG. 2. Furthermore, as shown in FIG. 2, a cooling cylinder protective material 15 can be provided.

Since such a cooling auxiliary cylinder can cool a crystal region having a high temperature, the silicon single crystal ingot can be efficiently cooled, and thereby the defect size can be reduced.

Figure 3:
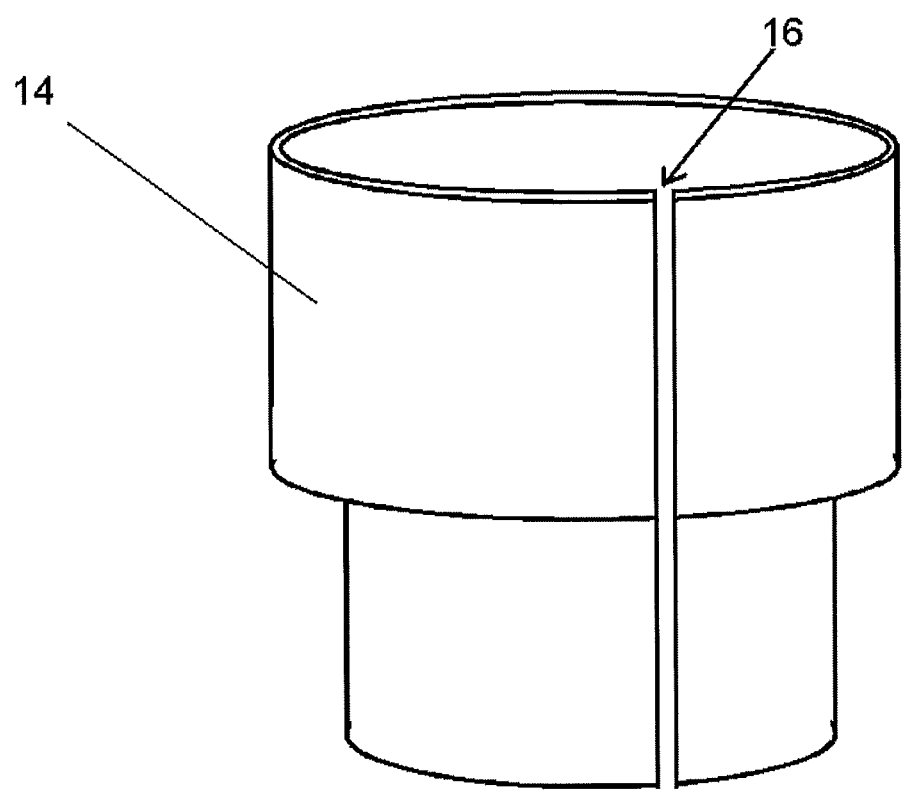
FIG. 3 is a schematic view showing a cooling auxiliary cylinder of the CZ single crystal manufacturing apparatus that can be used for the present invention.

Moreover, as shown in FIG. 3, in the cooling auxiliary cylinder 14, it is preferable to form a slit 16 that is continuous in the axial direction.

If such a slit is formed, the cooling auxiliary cylinder can be appressed against the cooling cylinder when it is thermally expanded, and a heat transferring capability can be increased.

It is preferable for a material of such a cooling cylinder 11 to be any one of iron, chrome, nickel, copper, titanium, molybdenum, tungsten, and an alloy containing one of these materials. Alternatively, it is also preferable for this material to be formed by covering a metal with any one of titanium, molybdenum, tungsten, and a platinum group metal is used. As this metal to be covered, any one of iron, chrome, nickel, copper, titanium, molybdenum, tungsten, and an alloy containing one of these materials is preferable.

As the material of the cooling cylinder 11, particularly SUS that is an alloy of iron, chrome, and nickel has high multiplicity of use and can be easily used.

Additionally, as a material of each of the cooling auxiliary cylinders 14 and 14', a material that is stable at high temperatures and has high thermal conductivity is preferable, and any one of a graphite material, a carbon composite, stainless, molybdenum, and tungsten is preferable. In particular, the graphite material that has a high thermal conductivity and a high heat radiation rate and can easily absorb heat from a crystal is preferable.

An example of a method for growing a silicon single crystal ingot by the single crystal manufacturing apparatus 20 will now be described hereinafter.

First, a high-purity polycrystalline raw material of silicon is heated to a melting point (approximately 1420° C.) or more and molten in the quartz crucible 5, thereby obtaining the raw material melt 4. Then, a tip of a seed crystal is brought into contact with or immersed in a substantially central portion of a surface of the raw material melt 4 by winding off a wire. Subsequently, the quartz crucible 5 and the graphite crucible 6 are rotated in an appropriate direction, the wire is taken up while rotation, and the seed crystal is pulled up to start growth of the silicon single crystal ingot 3.

Subsequently, a pulling rate and a temperature are appropriately adjusted so that oxygen concentration, a defect region, and V/G according to the present invention are provided, thereby obtaining the silicon single crystal ingot 3 having a substantially cylindrical shape.

In the present invention, at the time of growing the silicon single crystal ingot, it is preferable to dope nitrogen to grow the silicon single crystal ingot having nitrogen concentration of $1\times10^{13}$ to $1\times10^{16}$ ($/cm^3$).

When such nitrogen concentration is set, the defect size can be reduced and, on the other hand, single-crystallization of the silicon single crystal ingot is not inhibited.

The thus grown silicon single crystal ingot is subjected to slicing, chamfering, lapping, etching, polishing, and others, thereby fabricating the silicon single crystal wafer which has oxygen concentration of $7\times10^{17}$ atoms/cm$^3$ (ASTM'79) or less and includes a vacancy dominant region and from which FPDs are not detected by preferential etching. It is to be noted that, in the present invention, further increasing the growth rate to provide the silicon single crystal wafer having the vacancy dominant region on its entire surface is preferable in terms of productivity.

The above-described silicon single crystal wafer can be a high-quality low-cost wafer that is preferable for a power device without causing a breakdown voltage failure or a leak current failure of a fabricated device.

EXAMPLES

Although the present invention will now be more specifically explained hereinafter based on examples and comparative examples, the present invention is not restricted thereto.

Experiment 1

Defect characteristics of a low-oxygen crystal were first grasped.

Figure 4:
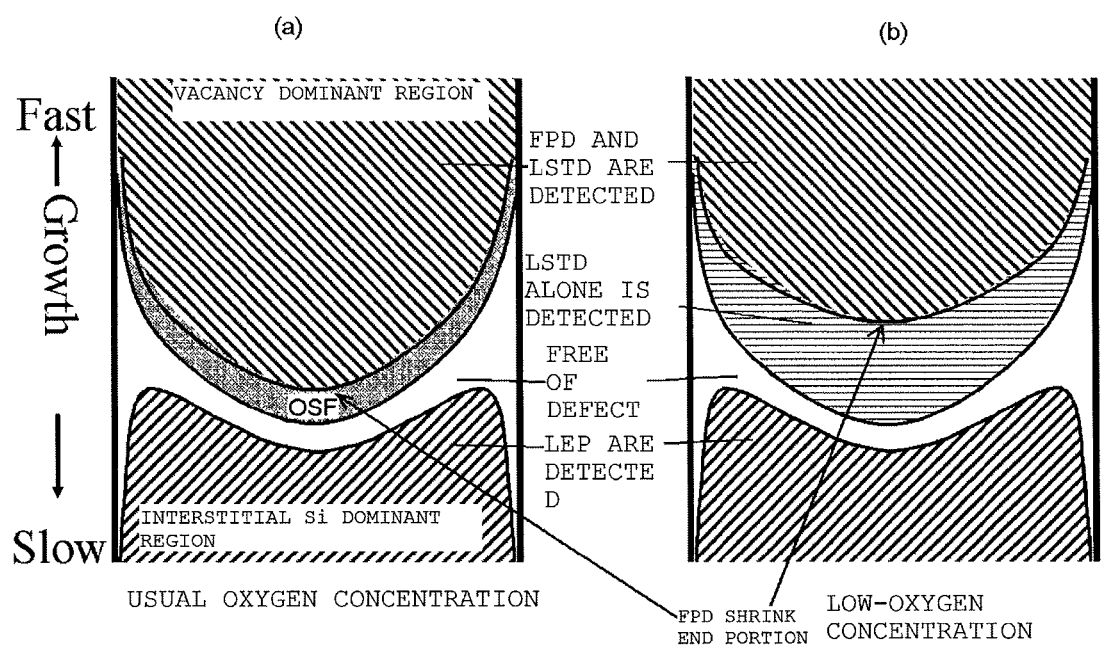
FIG. 4 is a schematic view showing defect regions depending on growth rates of silicon single crystal ingots having usual oxygen concentration and low-oxygen concentration.

A defect distribution in a silicon crystal having usual oxygen concentration relative to a growth rate is as schematically shown in FIG. 4(a). A vacancy dominant region is provided on a high growth rate side, and an interstitial Si dominant region is provided on a low growth rate side.

In the high rate side region, many silicon single crystal ingots having different oxygen concentration values were grown in the region where vacancies are sufficiently dominant that OSF nuclei are considered to adhere to an outer periphery when a wafer is sliced out. Wafer-shaped samples are sliced out from these silicon single crystal ingots and subjected to an FPD evaluation. As observation of FPDs, the wafer samples were subjected to surface grinding, cleaning, and mirror etching using a mixed acid, then the samples were left in an preferential etchant consisting of a hydrofluoric acid, a nitric acid, an acetic acid, and water without oscillation until a stock removal of etching became 25±3 μm on both sides, and FPDs were counted by an optical microscope.

Figure 5:
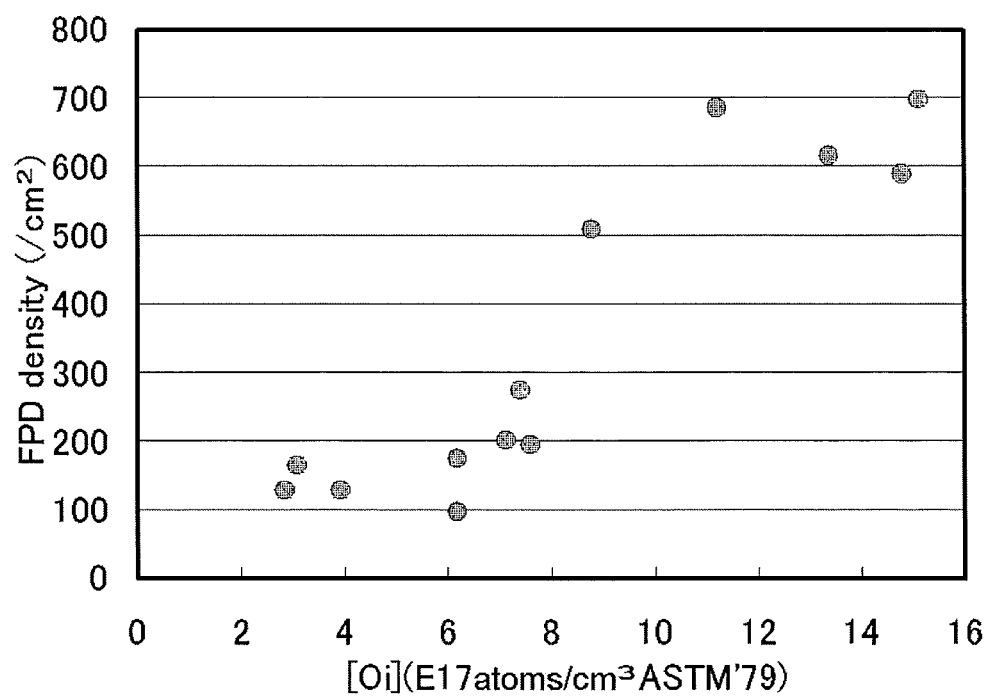
FIG. 5 is a graph showing a relationship between oxygen concentration and FPD density.

Oxygen concentration dependence was clearly observed in density of the detected FPDs as shown in FIG. 5. A phenomenon that the FPD density precipitously lowers with a reduction in oxygen concentration was observed in the oxygen concentration range of $8\times10^{17}$ atoms/cm$^3$ (ASTM'79) to $7\times10^{17}$ atoms/cm$^3$ (ASTM'79).

Figure 6:
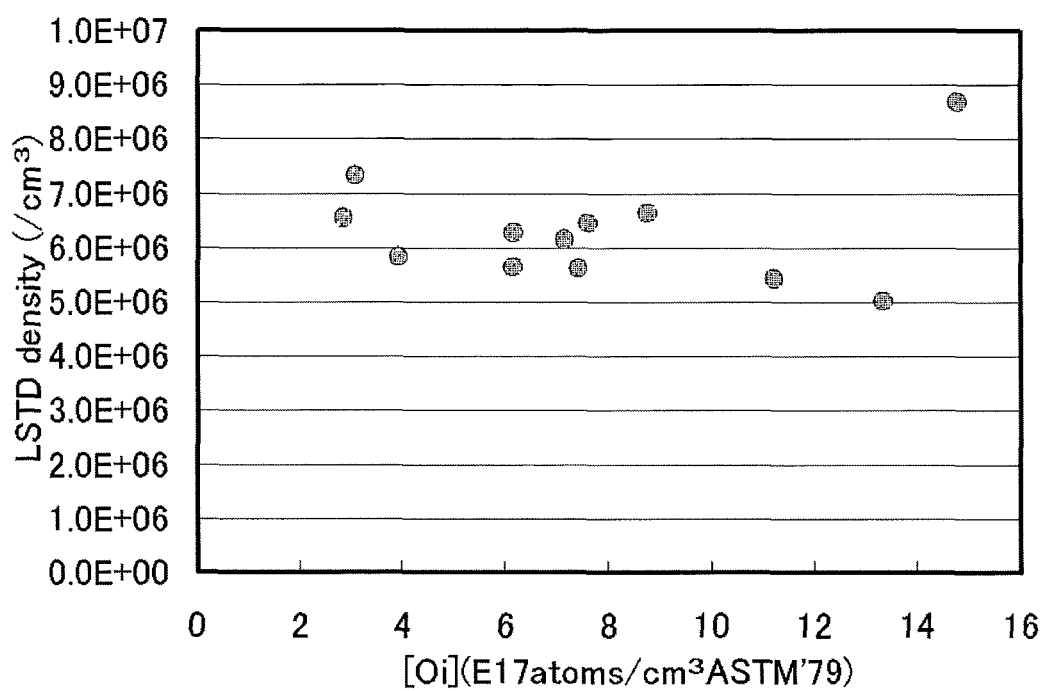
FIG. 6 is a graph showing a relationship between oxygen concentration and LSTD density.

On the other hand, the same sample as the sample from which the data was obtained was cleaved, and LSTD density was examined by using infrared scattering tomography (MO441 manufactured by Mitsui Mining & Smelting Co., Ltd.). FIG. 6 shows the result.

In comparison with the precipitous lowering of the FPD density involved by the reduction in oxygen concentration, the LSTD density was not affected by the oxygen concentration and has a substantially fixed value.

It is said that FPDs and LSTDs are cavities called voids. In a crystal having low oxygen concentration, there are defects that are detected as LSTDs but not detected as FPDs even though they are the same type of defects. As a reason why they are detected as the LSTDs but not detected as the FPDs, a small defect size or a change in a defect state is considered. In general, an internal wall oxide film is present in each void in a CZ crystal. However, it is considered that this internal wall oxide film is thinned and eventually disappears by a reduction in oxygen concentration. In the detection based on the FPDs, there is a possibility that thinning of the oxide film has an influence. On the other hand, since the LSTDs are detected by scattering of infrared rays, it is considered that scattering occurs when there is a difference in dielectric constant and hence the LSTDs are more sensitively detected with respect to each void having no oxide film.

Thus, it was understood that voids which are present in the vacancy dominant region are detected as the LSTDs as the oxygen concentration is lowered, but they are not detected as the FPDs. As described above, it is considered that this phenomenon is caused by a decrease in size and thinning of the internal wall oxide film in each void due to a reduction in oxygen concentration. In case of using the wafer for at least an advanced technology device such as a power device, if defects are not detected as the FPDs, there is no problem in usage.

Therefore, a technology that makes it difficult to detect defects as the FPDs by a reduction in oxygen concentration that is lower than $7\times10^{17}$ atoms/cm$^3$ (ATM'79) mentioned above is very important, and it can be applied to manufacture of the silicon single crystal wafer for a device such as a power device.

Experiment 2

Further, to see an influence given on defects that are detected as the FPDs by the oxygen concentration, an experiment of investigating a defect region while changing a growth rate was conducted.

As a single crystal manufacturing apparatus and a hot zone (HZ), the apparatus shown in FIG. 1 was used. This single crystal manufacturing apparatus has a water-cooled SUS cooling cylinder that is extended from ceiling portion of a main chamber toward a surface of a raw material melt and is formed into a cylindrical shape that surrounds a silicon single crystal ingot. Furthermore, a cooling auxiliary cylinder is fitted in this cylinder. This cooling auxiliary cylinder is made of a graphite material. Moreover, slit 16 cleaving in the longitudinal direction as shown in FIG. 3 is formed in the cooling auxiliary cylinder. A lower end of the cooling auxiliary cylinder is configured to extend to a lower side of a lower end of the cooling cylinder and cool the silicon single crystal ingot from a region having a higher temperature.

With the use of this apparatus, each silicon single crystal ingot having a diameter of 8 inches (200 mm) was grown based on the Czochralski method for applying a magnetic field (the MCZ method). It is noted that a magnetic field generation apparatus is not shown in Figures.

In the MCZ method, the silicon single crystal ingots were grown while gradually lowering a growth rate from a high rate toward a low rate. At this time, parameters that control oxygen concentration included in the silicon single crystal ingots alone were changed, other conditions were not changed, and two silicon single crystal ingots having different oxygen concentration values were grown.

Wafer-shaped samples were sliced out from the obtained silicon single crystal ingots, and oxygen concentration values were measured based on an FT-IR method. As a result, they were approximately $12 \times 10^{17}$ atoms/cm$^3$ (ASTM'79) and approximately $6.5 \times 10^{17}$ atoms/cm$^3$ (ASTM'79), respectively. A block adjacent to each sliced-out wafer-shaped sample was vertically cut along a crystal growth axis, and vertically divided samples were thereby fabricated. Each vertically divided sample was subjected to preferential etching by using the same flow as that of Experiment 1, and an FPD distribution was observed.

Each defect distribution was investigated, and the defect distribution in a sample having higher oxygen concentration was as shown in FIG. 4(a) whilst the defect distribution in a sample having lower oxygen concentration was as shown in FIG. 4(b). Of these distributions, the distribution of FPDs has a shape that shrinks from a portion of a high growth rate toward portion of a low growth rate. A ratio V/G of a growth rate V and a temperature gradient G near a crystal growth interface when a shrunk tip portion was grown (V/G at a maximum growth rate that does not lead to detection of FPDs) was obtained. Here, the reason why V/G is obtained is that discussing about a defect distribution by using a ratio of V/G is general in terms of a defect forming mechanism. G was obtained as a temperature gradient from a melting point to 1400° C. in a crystal central portion after a temperature distribution in a furnace structure actually adopted in the experiment was obtained with the use of simulation software FEMAG that enables a temperature analysis of the furnace structure.

Values of FPD shrink V/G (that is V/G when the shrunk tip portion was grown) obtained from the FPD distribution of the vertically divided crystal were 0.180 (mm$^2$/min·K) in case of the sample having high oxygen concentration in FIG. 4(a) and 0.186 (mm$^2$/min·K) in case of the low-oxygen sample shown in FIG. 4(b). Since both the samples have the same G, it was confirmed that the growth rate can be increased by 3% or more. Considering that a usual defect-free crystal growth margin is approximately 3 to 5%, it can be said that the FPD shrink growth rate (that is the growth rate when the shrunk tip portion was grown) was greatly increased due to a reduction in oxygen concentration. It was likewise confirmed from this experiment that a region where FPDs are not detected was enlarged by a reduction in oxygen concentration.

Experiment 3

Subsequently, a trial calculation of a defect size is performed to examine conditions to be achieved.

A mechanism that a grown-in defect is produced in a silicon crystal was proposed by Voronkov or Ammon or the like, and it can be explained by a point defect diffusion model examined by many engineers. An outline thereof is as follows.

First, point defects (vacancies and interstitial Si) having equilibrium concentration values were introduced at a melting point. The point defects introduced into a crystal are supersaturated since the equilibrium concentrations are lowered with a reduction in temperature involved by the crystal growth. The supersaturated point defects diffuse toward a surface of the crystal or a growth interface. At the time of this diffusion, since vacancies and interstitial Si have different equilibrium concentration values and temperature dependences of diffusion coefficient, the vacancies become dominant when a growth rate is high, and the interstitial Si becomes dominant when the growth rate is low. When the supersaturated dominant point defects form grown-in defects as secondary defects when a defect forming temperature zone is reached. They are voids when the vacancies are dominant, or displacement loops or the like when the interstitial Si is dominant. It is said that whether these point defects are dominant is determined by V/G that is a ratio of the growth rate V and the temperature gradient G near the crystal growth interface.

A maximum defect size was estimated based on this model.

First, concentration of the supersaturated point defects in a crystal central portion was estimated. In case of conditions of relatively rapid quenching, an influence of diffusion from the crystal central portion to the crystal surface is small, and supersaturation concentration of the point defects is greatly affected by the diffusion that occurs toward the growth interface that is called uphill diffusion. Thus, a temperature distribution of the crystal central portion in the axial direction was obtained by using simulation software FEMAG, temperatures from the melting point to a defect forming temperature zone were divided approximately every 20 degrees to calculate a one-dimensional uphill diffusion, and concentration of the supersaturated point defects was calculated in a simple manner. Then, a diffusion distance was obtained from a defect forming temperature zone passing time, and a maximum defect size when all the supersaturated point defects in the diffusion distance were assured to contribute to formation of one secondary defect was calculated. Although the defect forming temperature zone was set to 1150 to 1080° C., it was set to 1080 to 1040° C. since a forming temperature is said to be lowered when nitrogen is doped.

Figure 7:
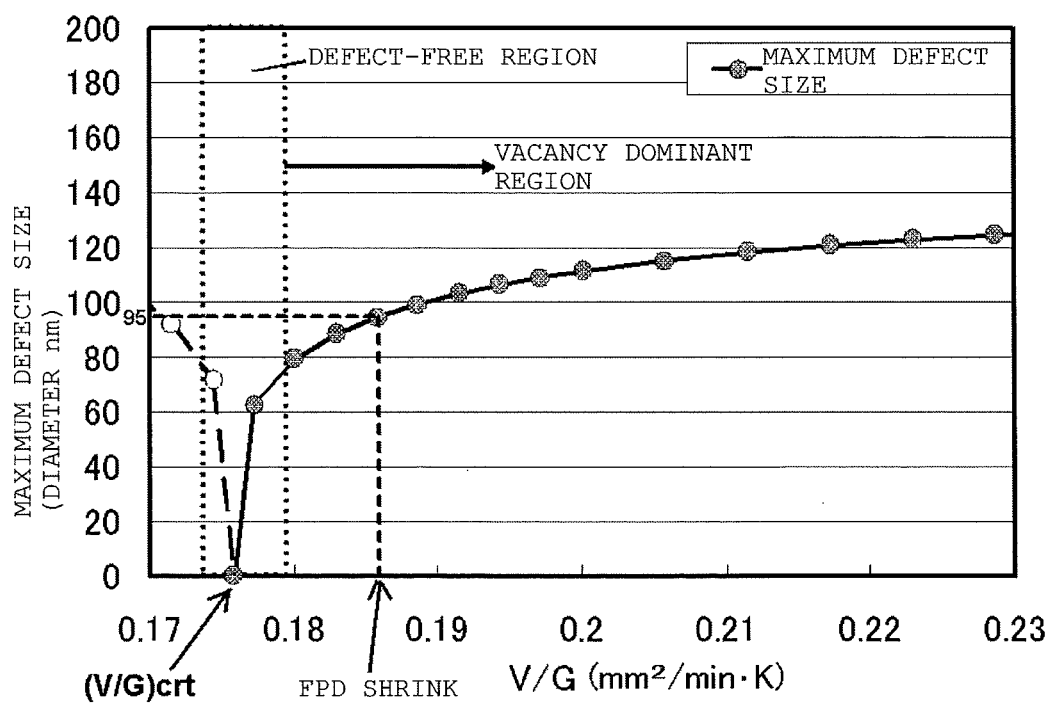
FIG. 7 is a graph showing a relationship between V/G and a maximum defect size.

A maximum defect size under the condition obtained by Experiment 2 (FPD shrink V/G) was estimated by using this technique. That is, the maximum defect size in defect sizes that are not detected as FPDs was estimated. FIG. 7 shows a result.

An axis of abscissa in a graph of FIG. 7 represents V/G which is a key parameter of the model (here, G was obtained as a temperature gradient from the melting point to 1400° C.). When V/G is approximately 0.175 (mm2/min·K), a defect size precipitously decreases and immediately increases. This portion is a so-called a defect-free region, and no defect is formed within approximately ±2% of V/G as the lowest point, thereby resulting in the defect-free region. Additionally, a region where V/G is smaller is a region where the interstitial Si is dominant, and a region where V/G is higher is a region where the vacancies are dominant. In general, since a region where V/G exceeds 0.180 ($mm^2$/min·K) has supersaturated vacancies in abundance, void defects are formed, and FPDs are detected.

However, as obtained in Experiment 2, in case of low oxygen concentration, when V/G is 0.186 ($mm^2$/min·K), the region of FPDs shrinks. Although the condition at this time is indicated by a broken line in FIG. 7, a maximum defect size calculated under this condition was 95 nm. Therefore, it is considered that FPDs are not detected in a crystal having low oxygen concentration lower than $7\times10^{17}$ atoms/$cm^3$ (ASTM'79) under a condition that the maximum defect size is 95 nm or less.

Thus, it can be said that, when the low-oxygen concentration crystal having the maximum defect size of 95 nm or less is grown, the excellent crystal in which FPDs are not detected can be grown even if the growth is performed at a high rate.

Example 1

The single crystal manufacturing apparatus and an in-furnace structure shown in FIG. 1 equal to those in Experiment 2 were used, and a silicon single crystal ingot that has no FPDs in a vacancy rich region and a diameter of 8 inches (200 mm) was grown based on the Czochralski method for applying a magnetic field (the MCZ method).

Figure 8:
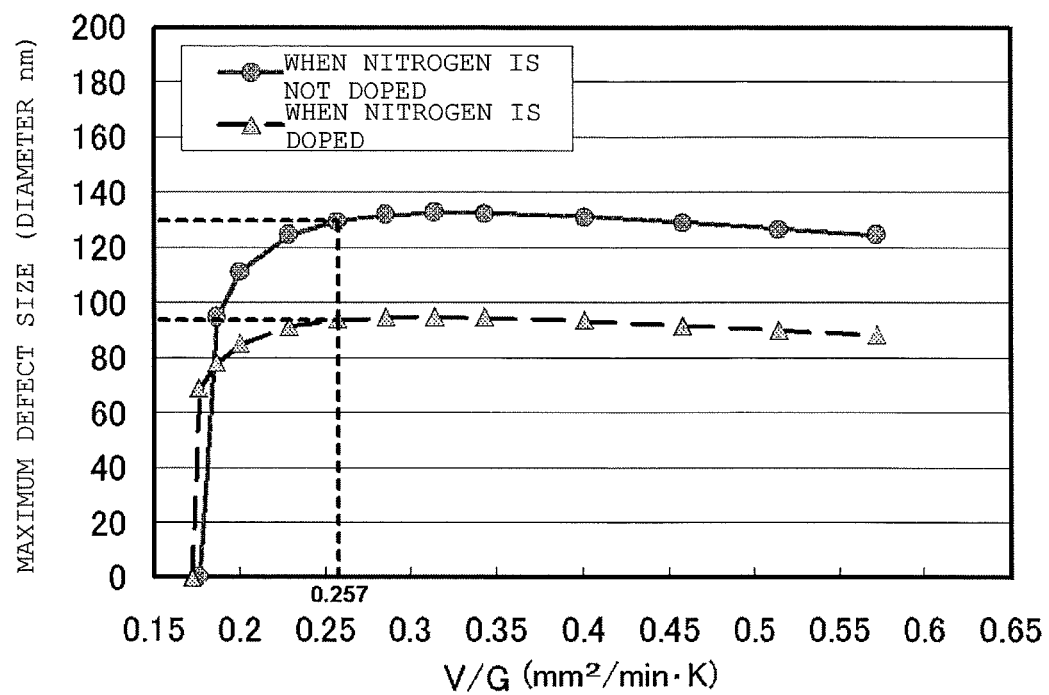
FIG. 8 is a graph showing a relationship between V/G and the maximum defect size investigated in Example 1.

First, a trial calculation of a defect maximum size as performed in Experiment 3 was performed. Although a trial calculation in case of no nitrogen was performed in Experiment 3, but a defect maximum size in case of doping nitrogen was also calculated. A defect forming temperature in case of doping nitrogen was set to 1080 to 1040° C. FIG. 8 shows a result. In case of doping no nitrogen, the result was the same as that shown in FIG. 7, and the defect maximum size was smaller than 95 nm only near a defect-free region. On the other hand, in case of doping nitrogen, the defect maximum size was smaller than 95 nm at any V/G.

Thus, a silicon single crystal ingot was grown while setting a growth rate V to approximately 0.9 mm/min. V/G at this time is 0.257 ($mm^2$/min·K) and meets the condition that V/G≥1.05×(V/G)crt (=0.184 $mm^2$/min·K), and it is a condition indicated by a dotted line in FIG. 8. Target oxygen concentration was set to $4\times10^{17}$ atoms/$cm^3$ (ASTM'79), and nitrogen was doped so that nitrogen concentration in the silicon single crystal ingot became 3 to $9\times10^{13}$ (/$cm^3$), thereby growing the silicon single crystal ingot.

Each wafer-shaped sample was sliced out from the silicon single crystal ingot grown under the above-described condition, and measurement of oxygen concentration and an FPD evaluation were performed. The oxygen concentration measured by the FT-IR method was approximately $4\times10^{17}$ atoms/$cm^3$ (ASTM'79) as intended. Furthermore, the FPD evaluation was carried out by the same method as those in Experiments 1 and 2. As a result, FPDs were not observed.

A polished wafer (PW) was fabricated from a block sliced out from this silicon single crystal ingot through processes such as slicing, etching, polishing, and others. As a result of fabricating an IG-BT which is one kind of power devices with using this polished wafer and performing an evaluation, it was confirmed that performance equivalent to that of a polished wafer adopting an FZ crystal (FZ-PW) used in the prior art was obtained. It is difficult to obtain a large-diameter crystal of 200 mm by the FZ method as compared with the CZ method, and a cost is high in the FZ method. Replacing the FZ crystal with the above-described CZ crystal facilitates reducing the cost.

Example 2

To more rapidly cool a silicon single crystal ingot than the apparatuses used in Experiment 2 and Example 1, a single crystal manufacturing apparatus and an in-furnace structure in which a cooling cylinder is arranged to be closer to a melt surface shown in FIG. 2 were used.

Although the basic structure is the same as that of the apparatus used in Experiment 2 or Example 1, a lower end of a cooling auxiliary cylinder 14' is provided at substantially the same height as a lower end of a cooling cylinder 11, and a crystal cooling capability is improved by pressing a carbon material having a high radiation rate against a cooling cylinder. The outer side of the cooling cylinder 11 does not contribute to crystal cooling but leads to an increase in heat loss, and hence it is covered with an heat insulating material 15.

Figure 9:
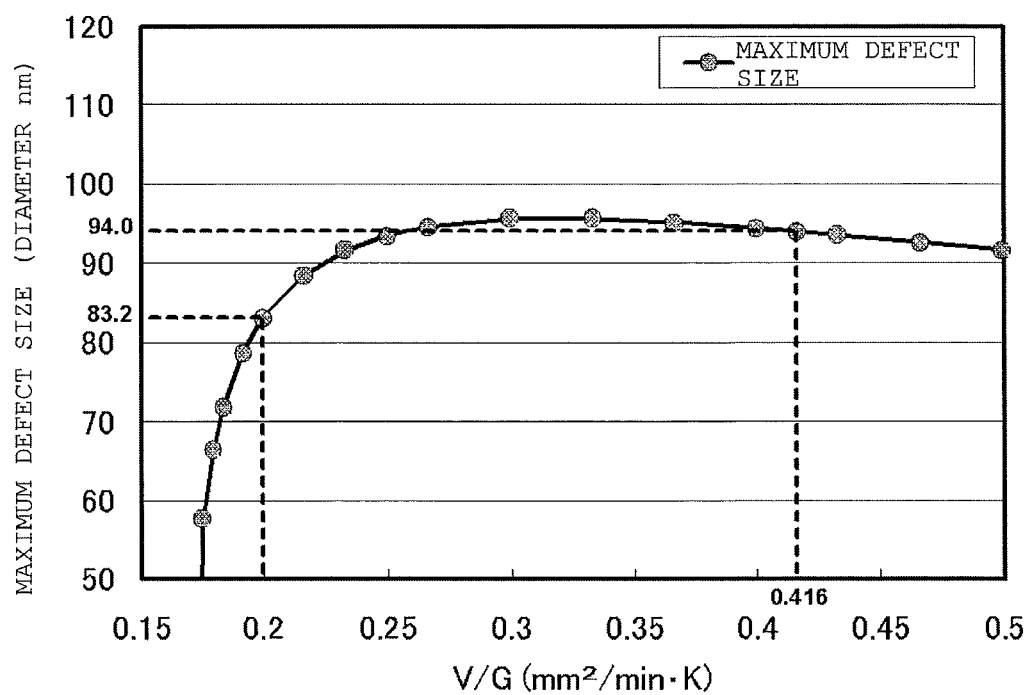
FIG. 9 is a graph showing a relationship between V/G and the maximum defect size investigated in Example 2.
Figure 10:
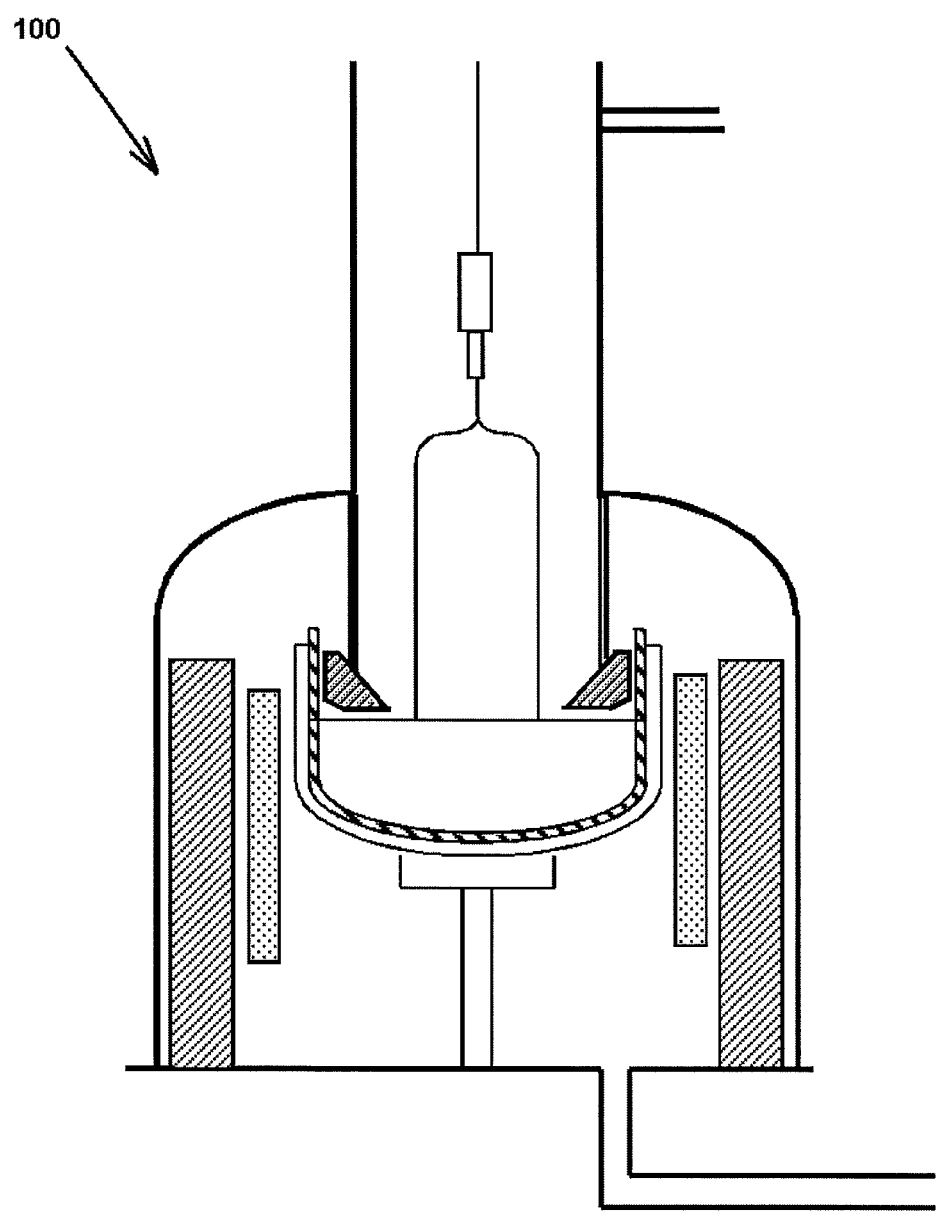
FIG. 10 is a schematic view showing a single crystal manufacturing apparatus used in Comparative Example 2.

FIG. 9 shows a result of performing a trial calculation of a defect maximum size of a silicon single crystal ingot when it was grown by an apparatus having such a structure. In FIG. 9, (V/G)crt was 0.175 ($mm^2$/min·K), V/G was 0.200 ($mm^2$/min·K) (≥1.05×(V/G)crt (=0.184 $mm^2$/min·K)) when a growth rate V was 1.2 mm/min, and a defect maximum size at this time was 83.2 nm. Furthermore, when the growth rate V was 2.5 mm/min, V/G was 0.416 ($mm^2$/min·K) (≥1.05×(V/G)crt (=0.184 $mm^2$/min·K)), and the defect maximum size at this time was 94.0 nm.

Based on the above-described result, target oxygen concentration was set to $4\times10^{17}$ atoms/$cm^3$ (ASTM'79), silicon single crystal ingots grown on two growth rate levels, i.e., 1.2 mm/min and 2.5 mm/min were grown, respectively. Like Example 1, oxygen concentration and FPDs were evaluated with respect to these silicon single crystal ingots. As a result, in the crystal grown at the growth rate of 1.2 mm/min, oxygen concentration was approximately $4\times10^{17}$ atoms/$cm^3$, FPDs were not detected, and target quality was obtained. On the other hand, in the crystal grown at the growth rate of 2.5 mm/min, the crystal deformed due to growth at the high rate, a dislocation occurred on the way, and hence a single-crystallized portion was evaluated. As a result, oxygen concentration was reduced to approximately $2\times10^{17}$ atoms/$cm^3$, FPDs were not detected, and target quality was obtained.

Comparative Example 1

A silicon single crystal ingot was grown under the same conditions as Example 1 except that target oxygen concentration was set to $12\times10^{17}$ atoms/$cm^3$ (ASTM'79). That is, with the use of the apparatus shown in FIG. 1, nitrogen was doped to achieve nitrogen concentration of 3 to $9\times10^{13}$ (/$cm^3$), and the silicon single crystal ingot was grown at a growth rate V=approximately 0.9 mm/rain. A sample sliced out from this silicon single crystal ingot was used to evaluate oxygen concentration and FPDs. As a result, the oxygen concentration was approximately $12\times10^{17}$ atoms/cm$^2$ (ASTM'79) as intended. On the other hand, FPDs were detected, and target quality was not obtained.

It is obvious from the above-described result that the reduction in oxygen concentration is one of important requirements.

Comparative Example 2

Figure 11:
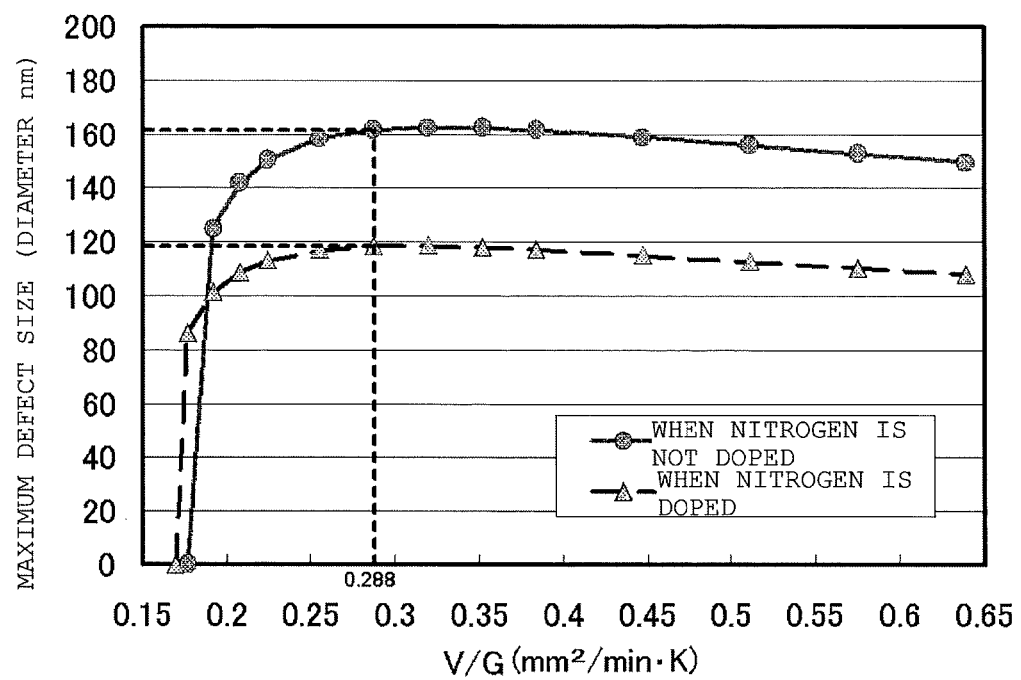
FIG. 11 is a graph showing a relationship between V/G and a maximum defect size investigated in Comparative Example 2.

As different from the single crystal manufacturing apparatus adopted in each of Examples 1 and 2, a single crystal manufacturing apparatus 100 and an in-furnace structure having no cooling cylinder was used. A result of performing a trial calculation of a maximum defect size in this apparatus was as shown in FIG. 11, and a maximum size was not lower than 95 nm except a portion near a defect-free region irrespective of presence/absence of nitrogen doping. With the use of this apparatus, a silicon single crystal ingot was grown while targeting low oxygen concentration under conditions of a growth rate V=0.9 mm/min and V/G=0.288 (mm$^2$/min·K). As a result, the oxygen concentration was as sufficiently low as $4\times10^{17}$ atoms/cm$^3$ (ASTM'79), but FPDs were detected, and target quality was not obtained. Like Example 1, a polished wafer (PW) was fabricated from this silicon single crystal ingot, IG-BT was fabricated and evaluated. As a result, a device failure occurred.

Thus, it can be understood that, even if the oxygen concentration is low, each defect size increased to be detected as an FPD at the growth rate higher than that in the defect-free region when the apparatus that has no cooling cylinder and others and is not configured to be a rapid cooling structure is used. Therefore, it is considered that cooling of the crystal is an important element.

It is to be noted that the above-described evaluation result concerns a power device to which a high voltage is applied, but the silicon single crystal wafer manufactured based on the present invention has no problem of failure of breakdown voltage or failure of leak current even in other devices such as a memory, a CPU, an image pickup device, and others that operates with a lower voltage. Therefore, the present invention is not a technology that is restricted to manufacture of the silicon single crystal wafer for a power device.

It is to be noted that the present invention is not restricted to the foregoing embodiment. The foregoing embodiment is an illustrated example, and any example that has substantially the same structure and exercises the same functions and effects as the technical concept described in claims according to the present invention is included in the technical scope of the present invention.

The invention claimed is:

1. A method for manufacturing a silicon single crystal wafer, comprising: growing a silicon single crystal ingot with the use of a CZ single crystal manufacturing apparatus; and slicing out a silicon single crystal wafer from the grown silicon single crystal ingot, wherein, under a growth condition that V/G≥1.05×(V/G)crt is achieved where V is a growth rate in growth of the silicon single crystal ingot, G is a temperature gradient near a crystal growth interface, and (V/G)crt is a value of V/G when a dominant point defect changes from a vacancy to interstitial Si, a silicon single crystal ingot having oxygen concentration of $7\times10^{17}$ atoms/cm$^3$ (ASTM'79) or less is grown, and a silicon single crystal wafer which includes a region where the vacancy is dominant and in which FPDs are not detected by preferential etching is manufactured from the grown silicon single crystal ingot, wherein, before growing the silicon single crystal ingot, a silicon single crystal ingot having oxygen concentration of $7\times10^{17}$ atoms/cm$^3$ (ASTM'79) or less was grown while changing the growth rate, V/G at a maximum growth rate in the extent that FPDs of the grown silicon single crystal ingot are not detected is obtained, each defect size that is not detected as the FPD in the silicon single crystal ingot grown under a condition of the obtained V/G is acquired based on point defect simulation, and the silicon single crystal ingot from which the silicon single crystal wafer is sliced out is grown under a condition such that a defect size becomes smaller than the previously obtained defect size that is not detected as FPD.

2. The method for manufacturing a silicon single crystal wafer according to claim 1, wherein, at the time of growing the silicon single crystal ingot, nitrogen is doped to grow the silicon single crystal ingot having nitrogen concentration of $1\times10^{13}$ to $1\times10^{16}$ (/cm$^3$).

3. The method for manufacturing a silicon single crystal wafer according to claim 1, wherein the silicon single crystal ingot is grown with the use of the CZ single crystal manufacturing apparatus comprising: a main chamber in which a crucible containing a raw material melt is arranged; a pulling chamber that is connected to an upper portion of the main chamber and accommodates the grown silicon single crystal ingot; a cooling cylinder that is extended from a ceiling portion of the main chamber toward a liquid level of the raw material melt contained in the crucible and surrounds the silicon single crystal ingot that is being grown; and a cooling auxiliary cylinder disposed on the inner side of the cooling cylinder.

4. The method for manufacturing a silicon single crystal wafer according to claim 2, wherein the silicon single crystal ingot is grown with the use of the CZ single crystal manufacturing apparatus comprising: a main chamber in which a crucible containing a raw material melt is arranged; a pulling chamber that is connected to an upper portion of the main chamber and accommodates the grown silicon single crystal ingot; a cooling cylinder that is extended from a ceiling portion of the main chamber toward a liquid level of the raw material melt contained in the crucible and surrounds the silicon single crystal ingot that is being grown; and a cooling auxiliary cylinder disposed on the inner side of the cooling cylinder.

5. The method for manufacturing a silicon single crystal wafer according to claim 3, wherein the CZ single crystal manufacturing apparatus in which a lower end of the cooling auxiliary cylinder is extended to a level of a lower end of the cooling cylinder or to a level below the lower end of the cooling cylinder but does not reach the liquid level of the raw material melt is used.

6. The method for manufacturing a silicon single crystal wafer according to claim 4, wherein the CZ single crystal manufacturing apparatus in which a lower end of the cooling auxiliary cylinder is extended to a level of a lower end of the cooling cylinder or to a level below the lower end of the cooling cylinder but does not reach the liquid level of the raw material melt is used.

7. The method for manufacturing a silicon single crystal wafer according to claim 3,
wherein the CZ single crystal manufacturing apparatus in which a slit that is continuous in an axial direction is formed in the cooling auxiliary cylinder is used.

8. The method for manufacturing a silicon single crystal wafer according to claim 4,
wherein the CZ single crystal manufacturing apparatus in which a slit that is continuous in an axial direction is formed in the cooling auxiliary cylinder is used.

9. The method for manufacturing a silicon single crystal wafer according to claim 5,
wherein the CZ single crystal manufacturing apparatus in which a slit that is continuous in an axial direction is formed in the cooling auxiliary cylinder is used.

10. The method for manufacturing a silicon single crystal wafer according to claim 3,
wherein the CZ single crystal manufacturing apparatus in which a material of the cooling cylinder is any one of iron, chrome, nickel, copper, titanium, molybdenum, tungsten, and an alloy containing any one of these materials or made by coating a metal with any one of titanium, molybdenum, tungsten, and a platinum group metal is used.

11. The method for manufacturing a silicon single crystal wafer according to claim 3,
wherein the CZ single crystal manufacturing apparatus in which a material of the cooling auxiliary cylinder is any one of a graphite material, a carbon composite, stainless, molybdenum, and tungsten is used.

* * * * *